US006965282B2

United States Patent
Kawachi et al.

(10) Patent No.: US 6,965,282 B2
(45) Date of Patent: Nov. 15, 2005

(54) SURFACE ACOUSTIC WAVE DEVICE WITH TWO SPLIT INTERDIGITAL TRANSDUCERS CONNECTED BY SPECIFIED ELECTRODE STRUCTURES

(75) Inventors: Osamu Kawachi, Kanagawa (JP); Motoyuki Tajima, Kanagawa (JP); Takuya Abe, Kanagawa (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 10/959,173

(22) Filed: Oct. 7, 2004

(65) Prior Publication Data
US 2005/0057325 A1    Mar. 17, 2005

Related U.S. Application Data

(63) Continuation of application No. PCT/JP03/04249, filed on Apr. 3, 2003.

(30) Foreign Application Priority Data

Apr. 19, 2002 (JP) .............................. 2002-117442

(51) Int. Cl.[7] .............................................. H03H 9/64
(52) U.S. Cl. ...................... 333/193; 333/194; 333/195; 310/313 B
(58) Field of Search ............................... 333/193–196; 310/313 B, 313 D

(56) References Cited

U.S. PATENT DOCUMENTS

| | | | | |
|---|---|---|---|---|
| 4,425,554 A | * | 1/1984 | Morishita et al. | 333/195 |
| 6,121,860 A | | 9/2000 | Tsutsumi et al. | 333/195 |
| 6,353,372 B1 | * | 3/2002 | Baier et al. | 333/195 |
| 6,667,673 B1 | * | 12/2003 | Strauss | 333/195 |
| 6,759,928 B2 | * | 7/2004 | Endou et al. | 333/193 |
| 2004/0251776 A1 | * | 12/2004 | Shibahara et al. | 310/313 D |

FOREIGN PATENT DOCUMENTS

| | | |
|---|---|---|
| EP | 1 168 611 A2 | 1/2002 |
| JP | 2-81511 | 3/1990 |

(Continued)

OTHER PUBLICATIONS

Jun Tsutsumi et al., *Transversely Coupled Resonate Filters with 0.1% Fractional Bandwith in Quartz*, Nov. 3-6, 1996, 65-69, 1996 IEEE Ultrasonic Symposium.
Supplementary European Search Report, dated Mar. 8, 2005.

*Primary Examiner*—Barbara Summons
(74) *Attorney, Agent, or Firm*—Arent Fox, PLLC.

(57) ABSTRACT

Improvement on an insertion loss, as well as phase balance, is obtained in surface acoustic wave device. In the surface acoustic wave device, when an aperture length of the electrode fingers of an interdigital transducer for input or an interdigital transducer for output is defined as X, the interdigital transducer for input or the interdigital transducer for output includes two split interdigital transducers respectively including electrode fingers having an aperture length of approximately X/2, and electrodes of respective electrode fingers in the first and second split interdigital transducers are extracted from the two split interdigital transducers, and disposed in such a way as signals in the two outputs or inputs connected to a balanced terminal pair have a phase difference of 180°, and the two split interdigital transducers are connected in series by a common electrode of solid shape, of which electrode width is greater than twice the pitch of the electrode fingers in the two split interdigital transducers, and further the common electrode is connected to the ground potential.

5 Claims, 12 Drawing Sheets

FOREIGN PATENT DOCUMENTS

| | | |
|---|---|---|
| JP | 10-22765 | 1/1998 |
| JP | 10-32463 | 2/1998 |
| JP | 2000-91883 | * 3/2000 |
| JP | 2001-292050 | * 10/2001 |
| JP | 2003-304141 | * 10/2003 |
| WO | WO 02/03549 A1 | 1/2002 |

* cited by examiner

SURFACE ACOUSTIC WAVE DEVICE WITH TWO SPLIT INTERDIGITAL TRANSDUCERS CONNECTED BY SPECIFIED ELECTRODE STRUCTURES

This nonprovisional application is a continuation application of and claims the benefit of International Application Number PCT/JP03/04249, filed Apr. 3, 2003. The disclosure of the prior application is hereby incorporated herein in its entirety by reference.

FIELD OF THE INVENTION

The present invention relates to surface acoustic wave device and more particularly surface acoustic wave device having a differential terminal pair.

TECHNICAL BACKGROUND

Today surface acoustic wave device is in wide use as a device having a filtering function in a high frequency circuit of wireless equipment, as an application example, typified by a cellular phone. In such a high frequency circuit of the wireless equipment, an integrated circuit (IC) element having a balanced or differential input/output has been used in recent years.

In contrast, a conventional filter employing surface acoustic wave device (hereafter referred to as SAW filter, as the case may be) has unbalanced terminals in both the input terminal and the output terminal. Therefore, it has been necessary to use a component for unbalanced-to-balanced conversion, which is referred to as balun, or an unbalanced-to-balanced converter constituted of discrete components.

Further, the SAW filter normally has an input/output impedance of 50 Ω. In contrast, an IC for a mixer having a balanced terminal pair, or the like, has a high impedance ranging from 100 Ω to 200 Ω in many cases. In order to connect such an IC with the SAW filter, an impedance conversion circuit has also been needed.

Under such circumstances, an increased number of circuit components has been brought to wireless equipment. Moreover, in order to achieve further miniaturization of such wireless equipment, a space-saving design is required. For this purpose, there has been studied and developed surface acoustic wave device incorporating both the unbalanced-to-balanced conversion function and the impedance conversion function, enabling miniaturization at the same time.

In the course of such study and development, the inventors of the present invention have proposed surface acoustic wave device having both an unbalanced-to-balanced conversion function and an impedance conversion function, disclosed as international application number PCT JP01/05677.

The basic structure of surface acoustic wave device disclosed in the above-mentioned application (PCT JP01/05677) is as illustrated in FIGS. 1 and 2.

FIG. 1 shows a structure of the electrodes constituting a surface acoustic wave (SAW) filter, and FIG. 2 shows surface acoustic wave device 10 in which this electrode structure is formed on a piezoelectric substrate.

An interdigital transducer (IDT) 100 for input and an interdigital transducer (IDT) 200 for output, both formed of a comb structure, are disposed on a propagation path of a surface acoustic wave formed on a piezoelectric substrate 11. Here, these input IDT 100 and output IDT 200 have a relation of reversibility. Accordingly, it is also possible to set reversely the IDT 100 side as an unbalanced output, and the IDT 200 side as balanced inputs, which will also be applicable in the following description.

Additionally, a piezoelectric substrate 11 having the electrode structure shown in FIG. 1 disposed thereon is obtained from a crystal substrate of either $LiTaO_3$ or $LiNbO_3$ cut out at a predetermined angle.

In FIG. 2, an input terminal IN, a grounding terminal GND and output terminals OUT1, OUT2 of the surface acoustic wave device are provided outside a non-illustrated package. Electrode pads formed on piezoelectric substrate 11 are connected to respective terminals through extension leads.

In FIGS. 1, 2, a first electrode finger 101 of comb shape on one side is connected to the input signal terminal IN, and the opposing second electrode finger 102 of comb shape is connected to the ground potential. A length X overlapping between the first electrode finger 101 and the second electrode finger 102 is referred to as an aperture length of IDT 100 for input.

Meanwhile, IDT 200 for output includes interdigital transducers (IDT) 201, 202, which are split into a first split and a second split. Each split has an aperture length X1, X2, which are approximately half in length of the aperture length X, disposed within the range of the aperture length X of IDT 100 for input.

The SAW filter is structured in such a way that an electrode finger on one side of the first split IDT 201 and an electrode finger on one side of the second split IDT 202 are connected to a balanced output terminal pair OUT1, OUT2, respectively. Further, the other electrode fingers of both the first split IDT 201 and the second split IDT 202 are connected in series by a common electrode 203.

With the structure shown in FIGS. 1, 2, it becomes possible that the terminal on the IDT 100 side for input be configured of unbalanced type, while the other terminal on the IDT 200 side for output be configured of balanced type. Further, because of the series connection between the first split IDT 201 and the second split IDT 202 constituting IDT 200 for output, it becomes possible to obtain the impedance of IDT 200 four times the impedance of IDT 100 for input.

Here, particularly the electrode fingers in the first and second split IDT 201, 202 are disposed so that the positions mutually deviate for one cycle, namely one half of the surface acoustic wavelength λ.

Further, in FIG. 1, the common electrode 203 disposed in the connection portion between IDT 201 and IDT 202 is connected through electrode 213 to the second electrode finger 102 connected to the ground potential GND of one electrode side of IDT 100 for input. This enables the common electrode 203 disposed in the portion connecting IDT 201 with IDT 202 to be connected forcedly to the ground potential GND. With such a structure, it becomes possible to obtain satisfactory phase difference balance of a signal on the balanced output terminal pair OUT1, OUT2.

Moreover, the electrode structure shown in FIG. 3 illustrates an application example of the basic electrode structure shown in FIG. 1 applied to double-mode surface acoustic wave device. Namely, based on IDT 100 for input and IDT 200 for output, reflectors REF1, REF2 are provided on the both sides of the multi-IDT (IDT 1–IDT 3, constituting three IDTs in the example shown in FIG. 3), thus forming a double-mode surface acoustic wave structure. The unbalanced input stage and the balanced output stage are connected in cascade connection.

In the structure shown in FIG. 3, the common electrode 203 connecting the split IDT 201 and IDT 202 in series is connected to the ground electrode in the neighboring IDT 204, 205. This also enables satisfactory phase difference balance in the surface acoustic wave device having a double-mode multi-IDT cascade connection structure shown in FIG. 3.

On the premise of employing the surface acoustic wave device having been disclosed in the aforementioned application of the invention by the inventor of the present invention, it is an object of the present invention to provide surface acoustic wave device having improved phase difference balance in balanced input terminals or balanced output terminals, and further preferably suppressing spurious in the pass band, and preventing an increase of an insertion loss.

DISCLOSURE OF THE INVENTION

As a first aspect of surface acoustic wave device according to the present invention to attain the aforementioned object, the surface acoustic wave device includes a piezoelectric substrate, and an interdigital transducer for input and an interdigital transducer for output, which are respectively disposed on a propagation path of a surface acoustic wave on the piezoelectric substrate and constituted of at least one interdigital transducer or more. When an aperture length of the electrode fingers of the interdigital transducer for input or the interdigital transducer for output is defined as X, the interdigital transducer for input or the interdigital transducer for output includes two split interdigital transducers respectively having electrode fingers of which aperture length is approximately X/2. Electrodes of the respective electrode fingers in the two split interdigital transducers are extracted from the two split interdigital transducers and disposed in such a way as signals in the two outputs or inputs connected to a balanced terminal pair have a phase difference of 180°. The two split interdigital transducers are connected in series by a common electrode of solid (not hollow) shape, of which electrode width is greater than twice the pitch of the electrode fingers in the two split interdigital transducers, and further the common electrode is connected to the ground potential.

As a second aspect of the surface acoustic wave device according to the present invention to attain the aforementioned object, in the first aspect, the surface acoustic wave device further includes an interdigital transducer neighboring the two split interdigital transducers. The common electrode is connected to the ground potential through the electrode finger of the neighboring interdigital transducer.

As a third aspect of the surface acoustic wave device according to the present invention to attain the aforementioned object, in the first aspect, the surface acoustic wave device further includes interdigital transducers for transmission and reception. The interdigital transducer for input and the interdigital transducer for output are connected in two stages by the interdigital transducers for transmission and reception.

As a fourth aspect of the surface acoustic wave device according to the present invention to attain the aforementioned object, the surface acoustic wave device includes a piezoelectric substrate, and an interdigital transducer for input and an interdigital transducer for output, which are respectively disposed on a propagation path of a surface acoustic wave on the piezoelectric substrate, and constituted of at least one interdigital transducer or more. When an aperture length of the electrode fingers of the interdigital transducer for input or the interdigital transducer for output is defined as X, the interdigital transducer for input or the interdigital transducer for output includes a first and second split interdigital transducers respectively having electrode fingers of which aperture length is approximately X/2. The electrodes of respective electrode fingers in the first and second split interdigital transducers are extracted from the two split interdigital transducers and disposed in such a way as signals in the two outputs or inputs connected to a balanced terminal pair have a phase difference of 180°. A gap is provided between a first common electrode commonly connecting the electrode fingers of the first split interdigital transducer and a second common electrode commonly connecting the electrode fingers of the second split interdigital transducer, and further the first and second common electrodes are connected to the ground potential.

As a fifth aspect of the surface acoustic wave device according to the present invention to attain the aforementioned object, in the fourth aspect, the surface acoustic wave device further includes an interdigital transducer neighboring the first and second split interdigital transducers. The first and second common electrodes of the first and second split transducers are connected to the ground potential through the electrode finger of the neighboring interdigital transducer.

As a sixth aspect of the surface acoustic wave device according to the present invention to attain the aforementioned object, in the fourth aspect, the surface acoustic wave device further includes interdigital transducers for transmission and reception. The interdigital transducer for input and the interdigital transducer for output are connected in two stages by the interdigital transducers for transmission and reception.

As a seventh aspect of the surface acoustic wave device according to the present invention to attain the aforementioned object, in the fourth aspect, the gap provided between the first common electrode and the second common electrode is connected on each end of the gap by an electrode.

As an eighth aspect of the surface acoustic wave device according to the present invention to attain the aforementioned object, in the fourth aspect, the gap provided between the first common electrode and the second common electrode is connected by a plurality of electrodes.

As a ninth aspect of the surface acoustic wave device according to the present invention to attain the aforementioned object, in the fourth aspect, the gap between the first common electrode and the second common electrode is connected by one electrode the length of which is smaller than the lengths of the first and second common electrodes.

Further scopes and features of the present invention will become more apparent by the following description of the embodiments with the accompanying drawings.

PREFERRED EMBODIMENTS OF THE INVENTION

The preferred embodiments of the present invention are described hereinafter referring to the charts and drawings.

Figure 1:
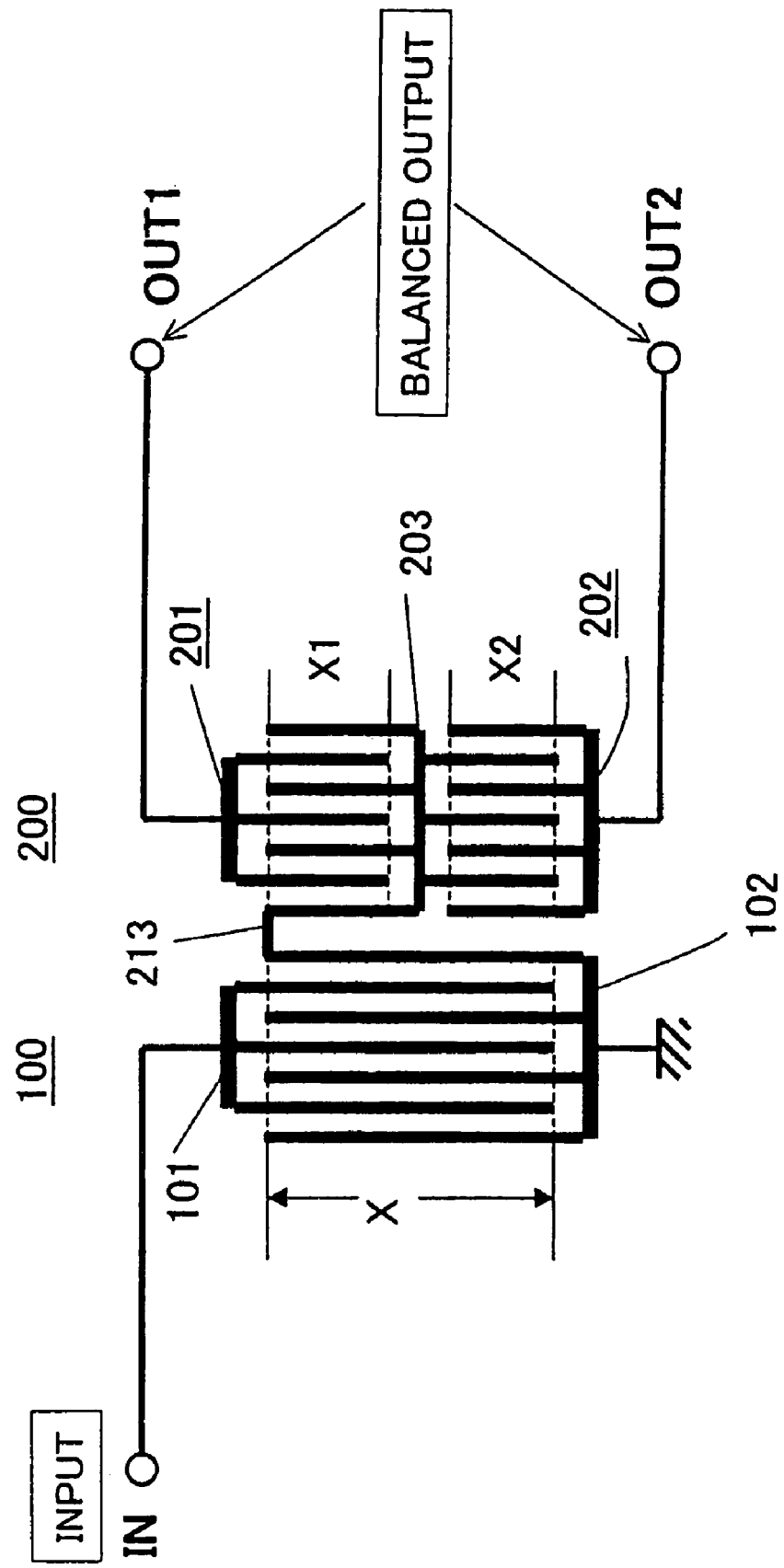
FIG. 1 shows a diagram illustrating an electrode structure constituting a surface acoustic wave (SAW) filter having been proposed in the foregoing invention.
Figure 2:
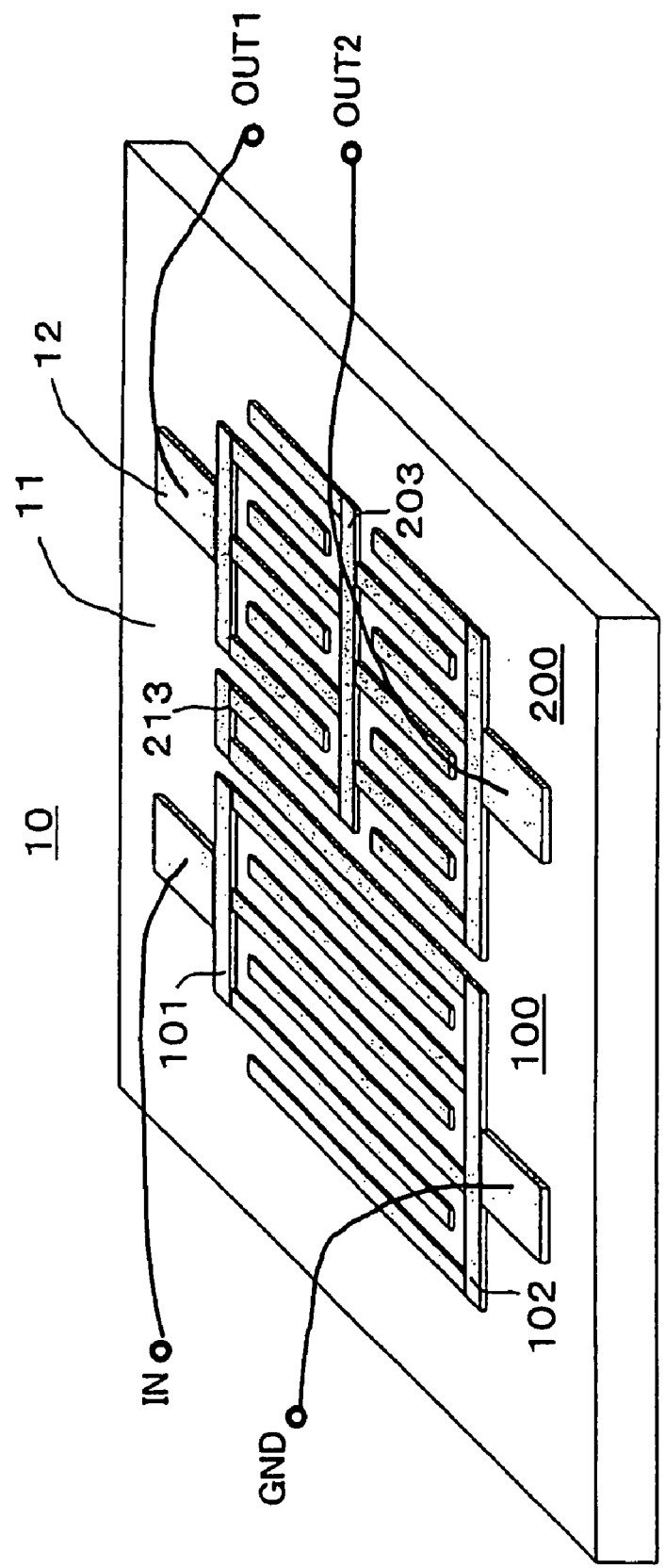
FIG. 2 shows a diagram illustrating surface acoustic wave device in which the electrode structure shown in FIG. 1 is formed on a piezoelectric substrate.
Figure 4:
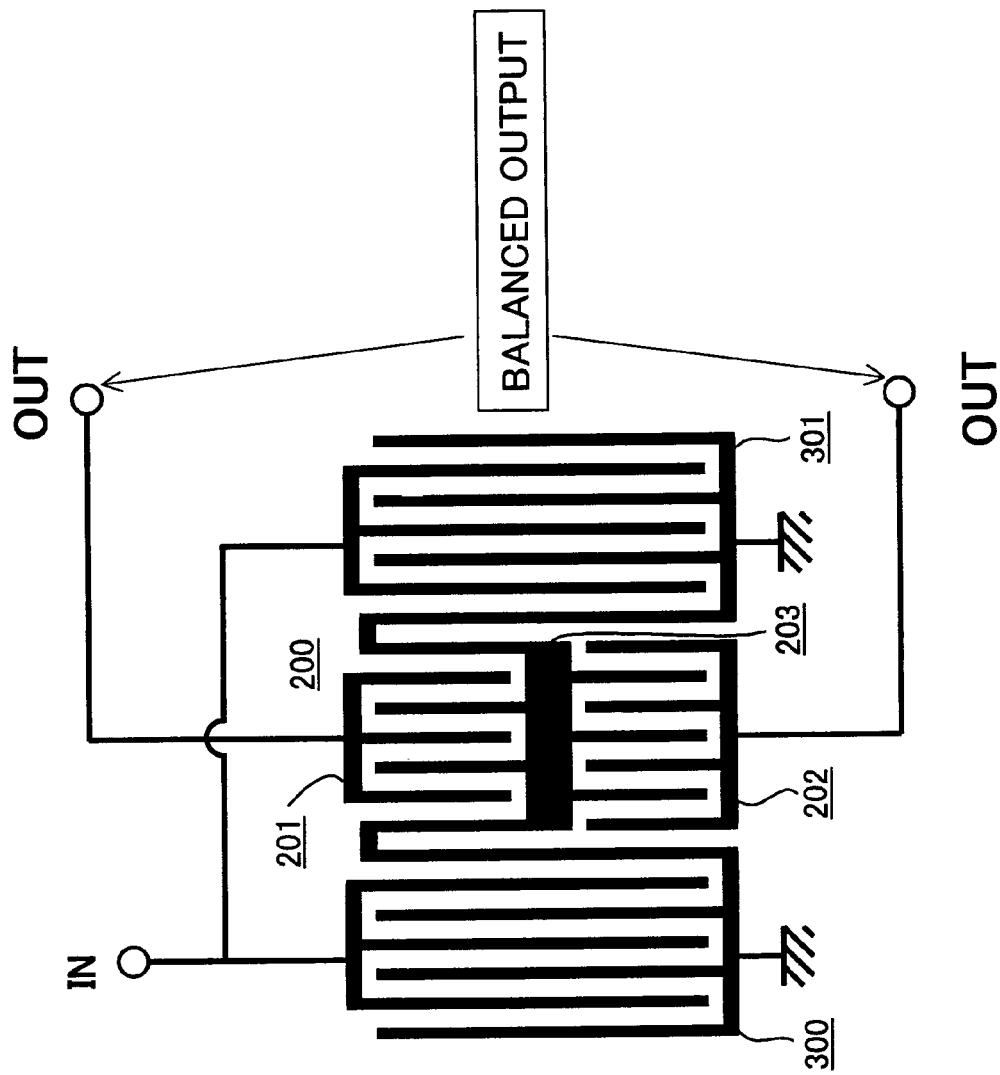
FIG. 4 shows a diagram illustrating an embodiment in which a first feature of the present invention is achieved.

FIG. 4 shows an embodiment of the present invention, in which the first feature of the present invention is achieved. Although only the electrode structure is shown in this figure, similarly to FIG. 1, surface acoustic wave device is formed on a piezoelectric substrate with this electrode structure in a similar way to FIG. 2. This is also applicable to the succeeding embodiments, in which only electrode structures are shown for the sake of simple explanation.

In FIG. 4, the embodiment is constituted of input IDT 300, input IDT 301, and IDT 200 for balanced output including a first split IDT 201 and a second split IDT 202 connected in series.

Additionally, hereafter, impedances in FIG. 4 will be mentioned. Impedances of input IDT 300, 301 provided on both sides are respectively 100 Ω. Connecting input IDT 300, 301 commonly to the IN terminal produces the input impedance of 50 Ω. As for output IDT 200, the impedance prior to the splitting is 50 Ω, and the impedance posterior to the splitting is 100 Ω, respectively. Further, as a result of connecting in series, the output impedance of 200 Ω is obtained, which corresponds to four times the input impedance. Also, in this figure, an image that the number of electrode pairs provided in input IDT is equal to that provided in output IDT is illustrated. However, according to one embodiment, the number of electrode pairs in output IDT 200 is approximately twice the number in input IDT. Accordingly, the impedance of output IDT 200 prior to the splitting is 50 Ω, which is half of the impedance of one input IDT.

As a feature of this embodiment in accordance with the present invention, it is to be noted that the electrode width of the common electrode 203 connecting the first split IDT 201 and the second split IDT 202 in series is set greater than the wavelength λ of the surface acoustic wave.

Figure 3:
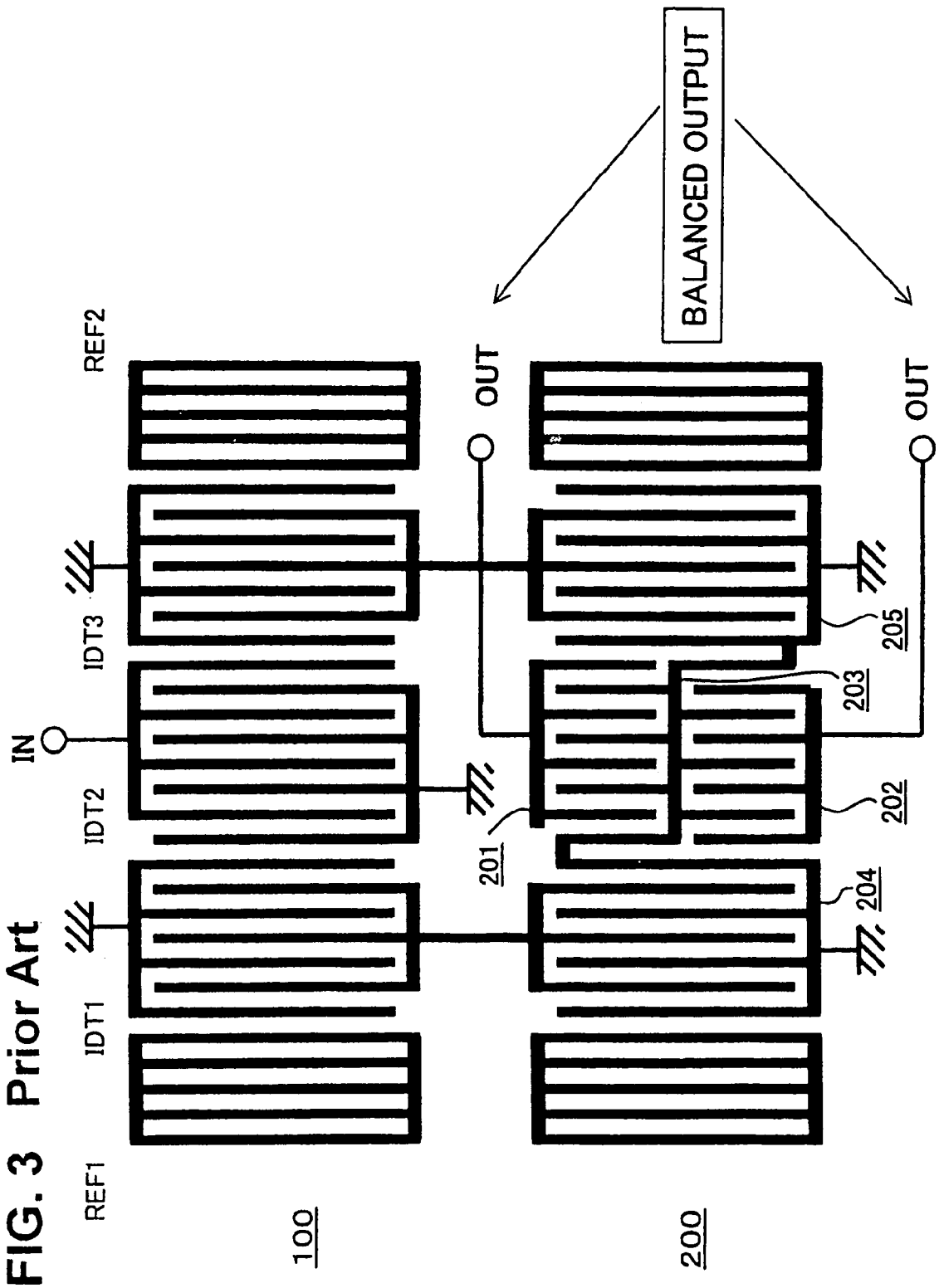
FIG. 3 shows a diagram illustrating an application example in which the basic electrode structure shown in FIG. 1 is applied to double-mode surface acoustic wave device.
Figure 5:
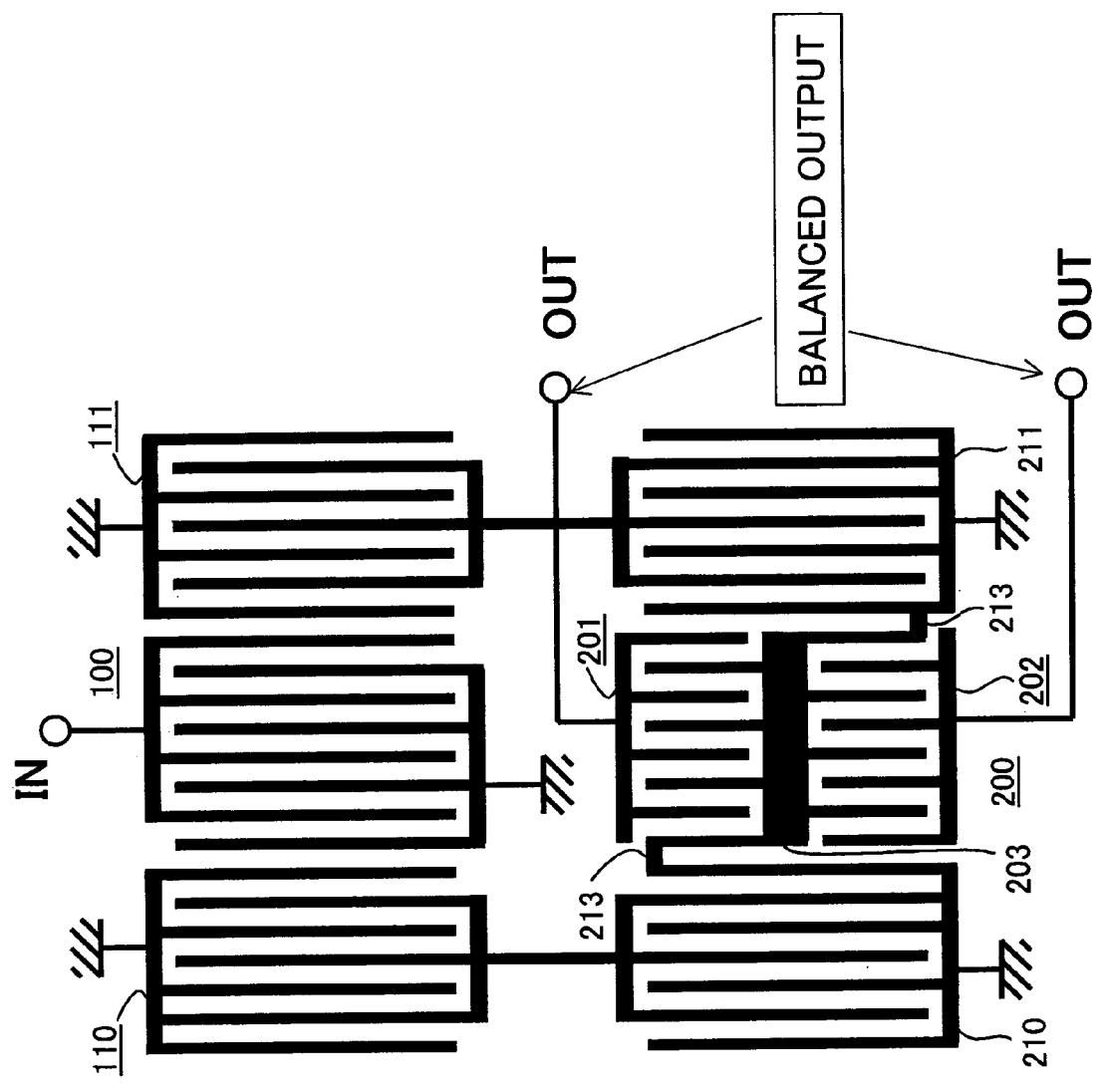
FIG. 5 shows a diagram illustrating a second embodiment achieving the first feature of the present invention, having a structure corresponding to the example shown in FIG. 3, in which an input stage and an output stage are connected in cascade.

FIG. 5 shows a second embodiment achieving the first feature of the present invention, in which an input stage and an output stage are structured in cascade connection, corresponding to the structure example shown in FIG. 3.

The input stage is constituted of IDT 100 for input having an unbalanced input terminal, and IDT 110, 111 for transmission transferring the surface acoustic wave having been generated in IDT 100 for input to the output stage. Meanwhile, the output stage is constituted of IDT 210, 211 for reception respectively connected in series to the IDT 110, 111 for transmission provided in the input stage, and IDT 200 for output having balanced output terminals.

In the embodiment shown in FIG. 5, IDT 200 for output is constituted of a first split IDT 201 and a second split IDT 202, similarly to the embodiment shown in FIG. 4.

The common electrode 203, which connects the first split IDT 201 and the second split IDT 202 in series, is forcedly connected to the ground potential through the comb electrode fingers of IDT 210, 211 for reception. Further, the electrode of the common electrode 203 connecting the first split IDT 201 and the second split IDT 202 in series has an electrode width greater than twice the pitch of each electrode finger (which corresponds to the wavelength λ of the surface acoustic wave) of the first split IDT 201 and the second split IDT 202.

As a common feature of the aforementioned embodiments shown in FIG. 4 and FIG. 5, the common electrode 203 connecting the first split IDT 201 and the second split IDT 202 in series is structured of solid shape, has an electrode width greater than twice the pitch of each electrode finger of the first split IDT 201 and the second split IDT 202. Because of this first feature of the present invention, it becomes possible to obtain better improved phase difference.

Figure 6:
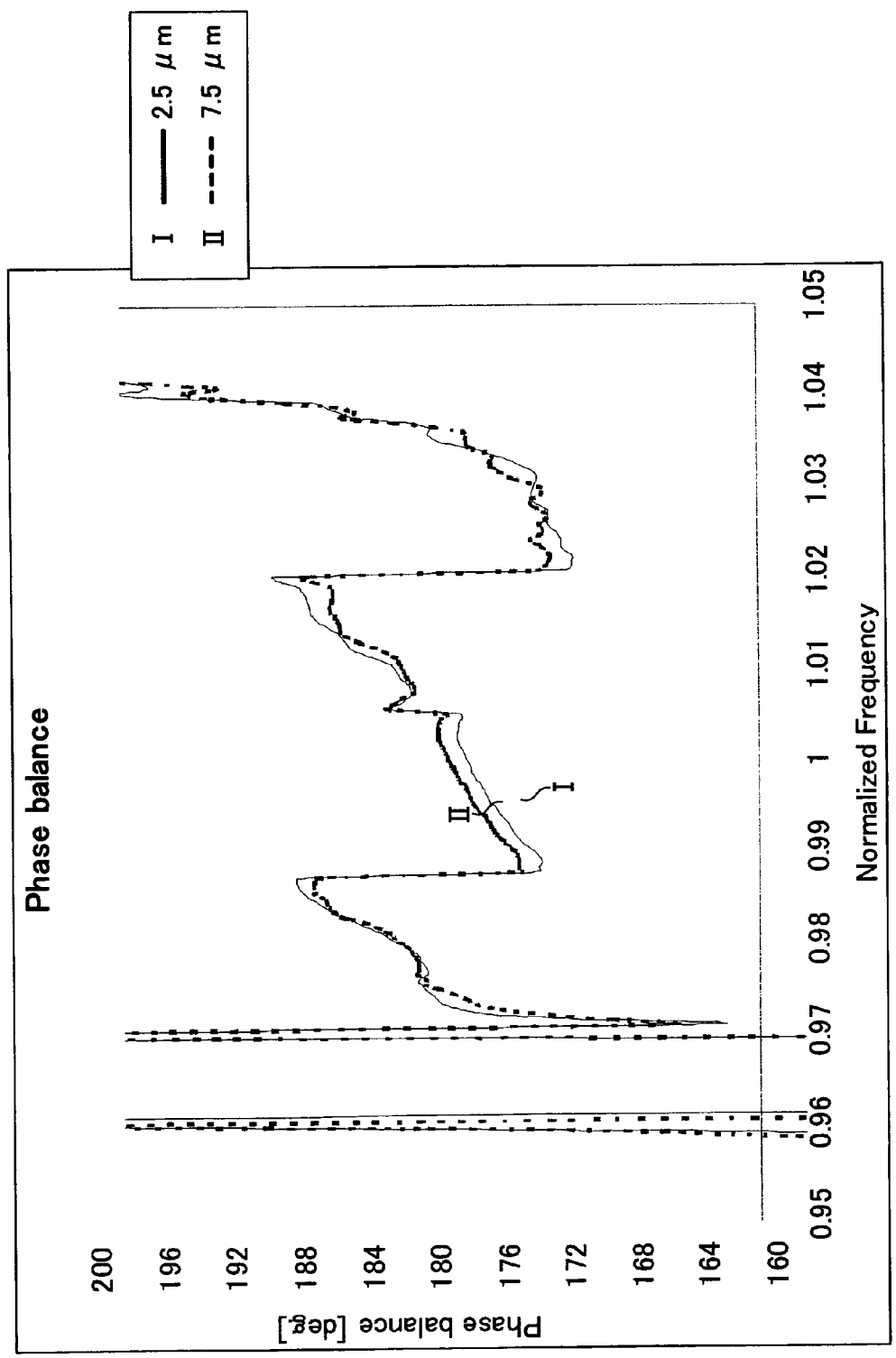
FIG. 6 shows a diagram illustrating an improvement of phase difference balance in the SAW filter according to the first feature of the present invention.

FIG. 6 shows a diagram illustrating improved phase difference balance in the SAW filter according to the first feature of the present invention. In FIG. 6, a graph I shows a phase balance characteristic of the SAW filter having an input stage and an output stage, respectively constituted of three IDTs 1–3 connected in cascade, in a similar way to the electrode structure shown in FIG. 3.

Further, in the structure shown above, IDT 1, 3 among three IDTs 1–3 in the input stage are respectively divided into three blocks. In regard to the number of electrode pairs and the wavelengths λ (=electrode pitch [λ/2]×2) of these blocks, from the left block to the right, the number of electrode pairs are 12-2-1.5 [pairs], the wavelengths are 4.43-4.315-4.005 [μm], and the electrode aperture length X is 244 μm. Also, IDT 2 is divided into three blocks. In regard to the number of electrode pairs and the wavelength λ (=electrode pitch [λ/2]×2) of the divided blocks, from the left block to the right, the number of electrode pairs are 2.5-14-2.5 [pairs], the wavelengths are 4.21-4.47-4.21 [μm], and the electrode aperture length X is 244 μM.

Meanwhile, IDT 1, 3 among the three IDTs 1–3 in the output stage are respectively divided into three blocks. In regard to the number of electrode pairs and the wavelengths λ (=electrode pitch [λ/2]×2) of these divided blocks, from the left block to the right, the number of electrode pairs are 12-2-1.5 [pairs], the electrode wavelengths are 4.43-4.315-4.005 [μm], and the electrode aperture length X is 244 μm. Further, IDT 2 is constituted of two split IDT, which are respectively divided into three blocks. In regard to the wavelength λ (=electrode pitch [λ/2]×2), from the left block to the right, the number of electrode pairs are 2.5-14-2.5 [pairs], the wavelengths are 4.21-4.47-4.21 [μm], and the electrode aperture length X is 133 μm.

In the SAW filter having the above-mentioned electrode structure, a graph I shown in FIG. 6 illustrates the characteristic when the electrode width of the common electrode 203 connecting the two split IDT in series is set as 2.5 μm (<the center block wavelength λ=4.47 μm)

In the meantime, a graph II shown in FIG. 6 illustrates the characteristic when the electrode width of the common electrode 203 connecting the two split IDT in series is set as 7.5 μm (>the center block wavelength λ=4.47 μm).

In these characteristic graphs, the pass band of the SAW filter is within the range of 0.98–1.02 in normalized frequency, and the phase difference range at that time is 174°–186° in case the electrode width is 7.5 μm, or 173°–188° in case the electrode width is 2.5 μm.

Accordingly, from the graphs shown in FIG. 6, in the aforementioned embodiments shown in FIGS. 4, 5, it may be understood that improved phase difference balance in the balanced output terminals or the balanced input terminals can be obtained, when the electrode width of electrode 203 connecting the first split IDT 201 and the second split IDT 202 in series is set greater (graph→graph II).

Meanwhile, it has been reported that the electrode width of electrode 203 connecting the first split IDT 201 and the second split IDT 202 in series is desired to be set smaller than the wavelength λ of the surface acoustic wave in view of a spurious characteristic in the pass band (in the official gazette of the Japanese Unexamined Patent Publication Number 2001-292050).

It has been confirmed by the inventor of the present invention that the insertion loss becomes greater as the electrode width of electrode 203 connecting the first split IDT 201 and the second split IDT 202 in series is set greater, because a dip (also referred to as notch or spurious) is generated in the pass band. The principle of the dip generation is that mutual interference is produced between vibration in a transverse mode (on the forwarding direction of the surface acoustic wave) produced in each of the first split IDT 201 and the second split IDT 202 and a longitudinal signal mode produced between IDT 201 and IDT 202.

Therefore, the inventors of the present invention have been studying on the prevention of an increased insertion loss caused by the above-mentioned dip, while maintaining the effect of improved phase difference balance resulting from the first feature of the present invention, in which the electrode width of electrode 203 connecting the first split IDT 201 and the second split IDT 202 in series is set greater than the wavelength λ of the surface acoustic wave.

Figure 7:
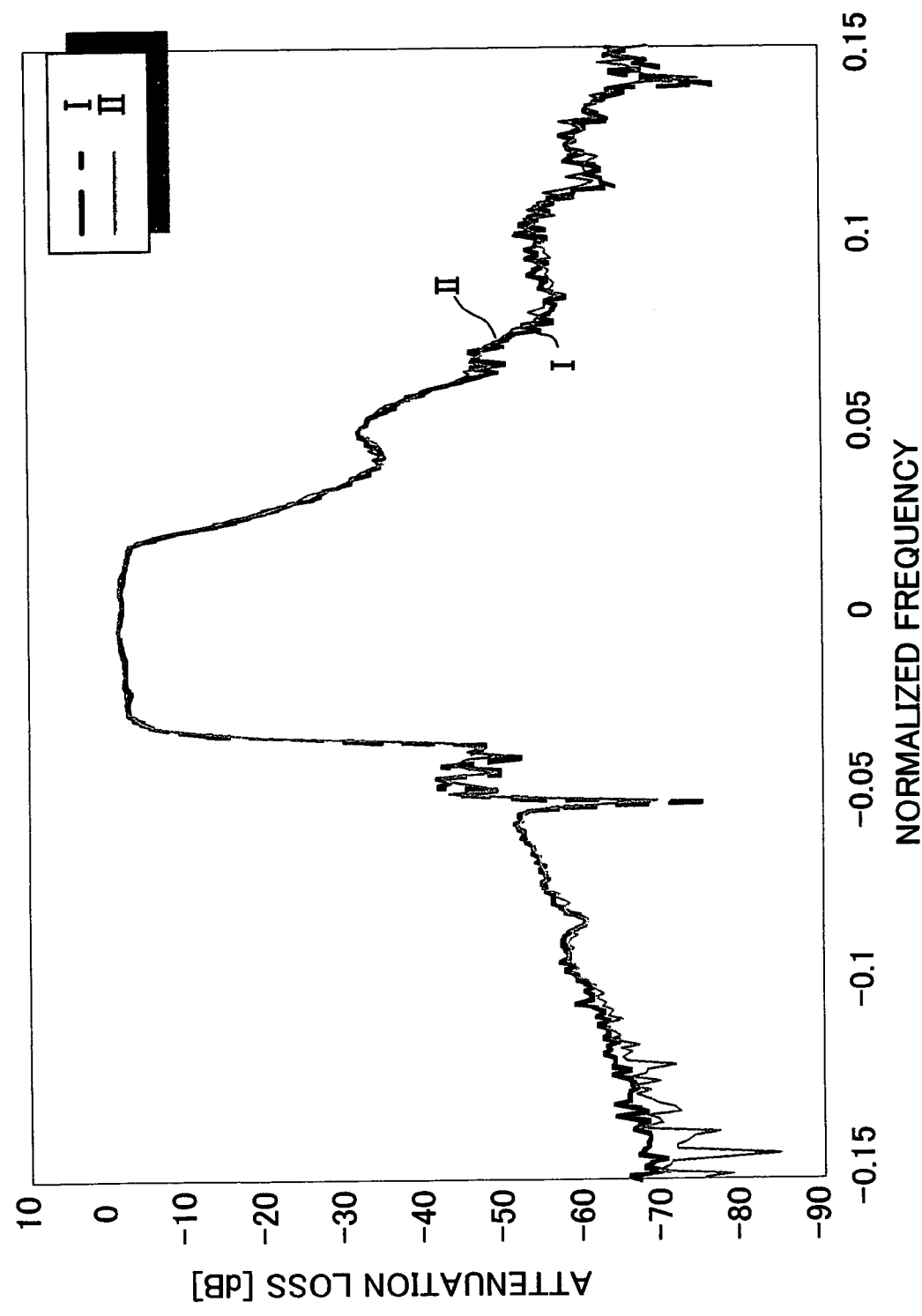
FIG. 7 shows a comparison diagram comparing the attenuation characteristics between the embodiment based on the first feature of the present invention only and the embodiment incorporating the second feature in addition to the first feature.

FIG. 7 shows a diagram comparing attenuation characteristics of the following two embodiments: One embodiment is based on only the first feature of the present invention to improve the phase balance by setting the electrode width of electrode 203 connecting the first split IDT 201 and the second split IDT 202 in series greater than the wavelength λ of the surface acoustic wave; and the other embodiment includes the second feature of the present invention, which will be described later, in addition to the first feature so as to improve on an increased insertion loss resulting from a dip caused by spurious.

Figure 8:
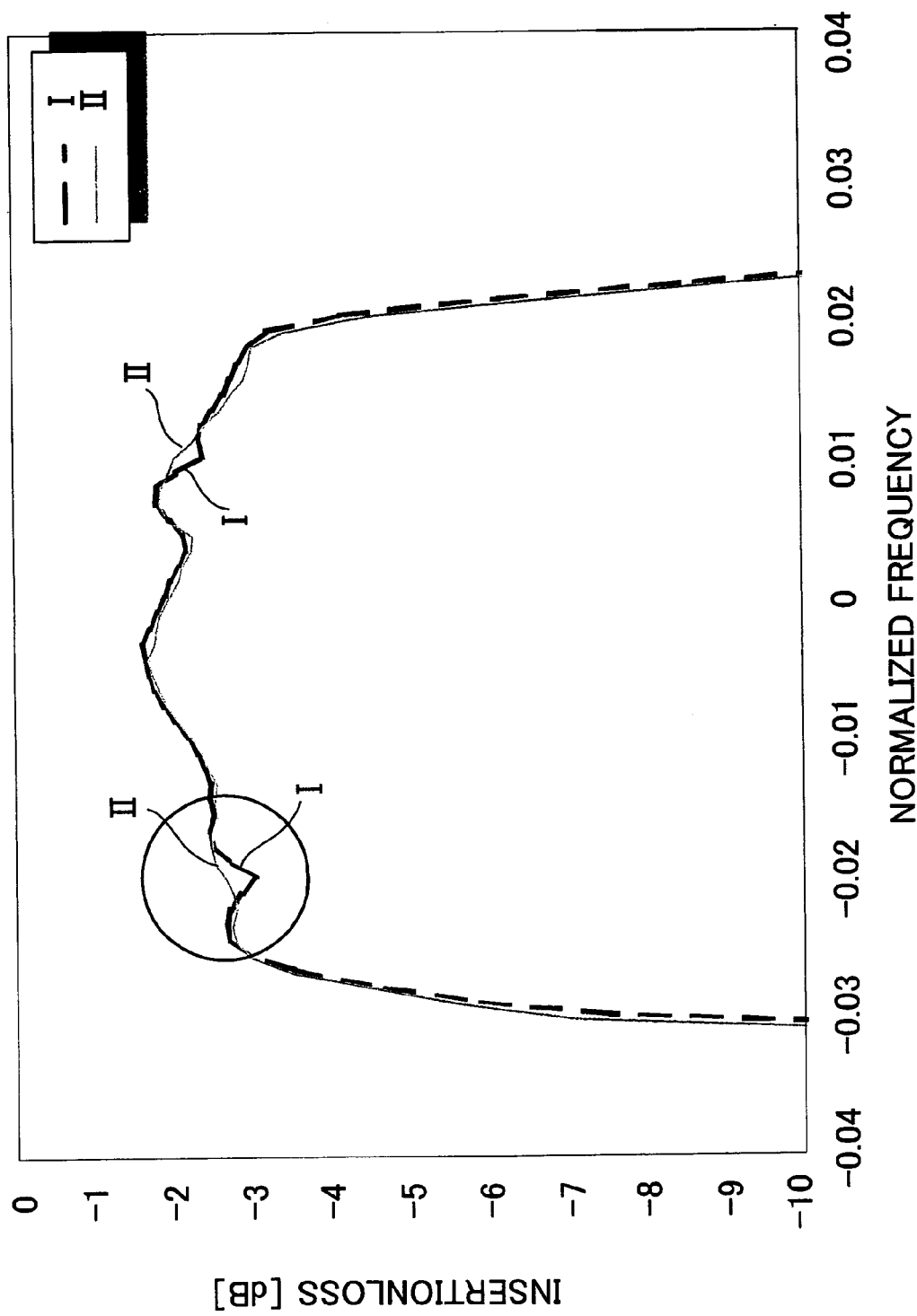
FIG. 8 shows a diagram in which the pass band portion in FIG. 7 is enlarged.

FIG. 8 further shows an enlarged diagram by enlarging a pass band portion shown in FIG. 7. In FIG. 8, in the characteristic of the first embodiment, in which the electrode width of electrode 203 connecting the first split IDT 201 and the second split IDT 202 in series is set to a greater value than the wavelength λ of the surface acoustic wave, it may be recognized that a dip is produced at the portion enclosed by a circle.

Figure 9:
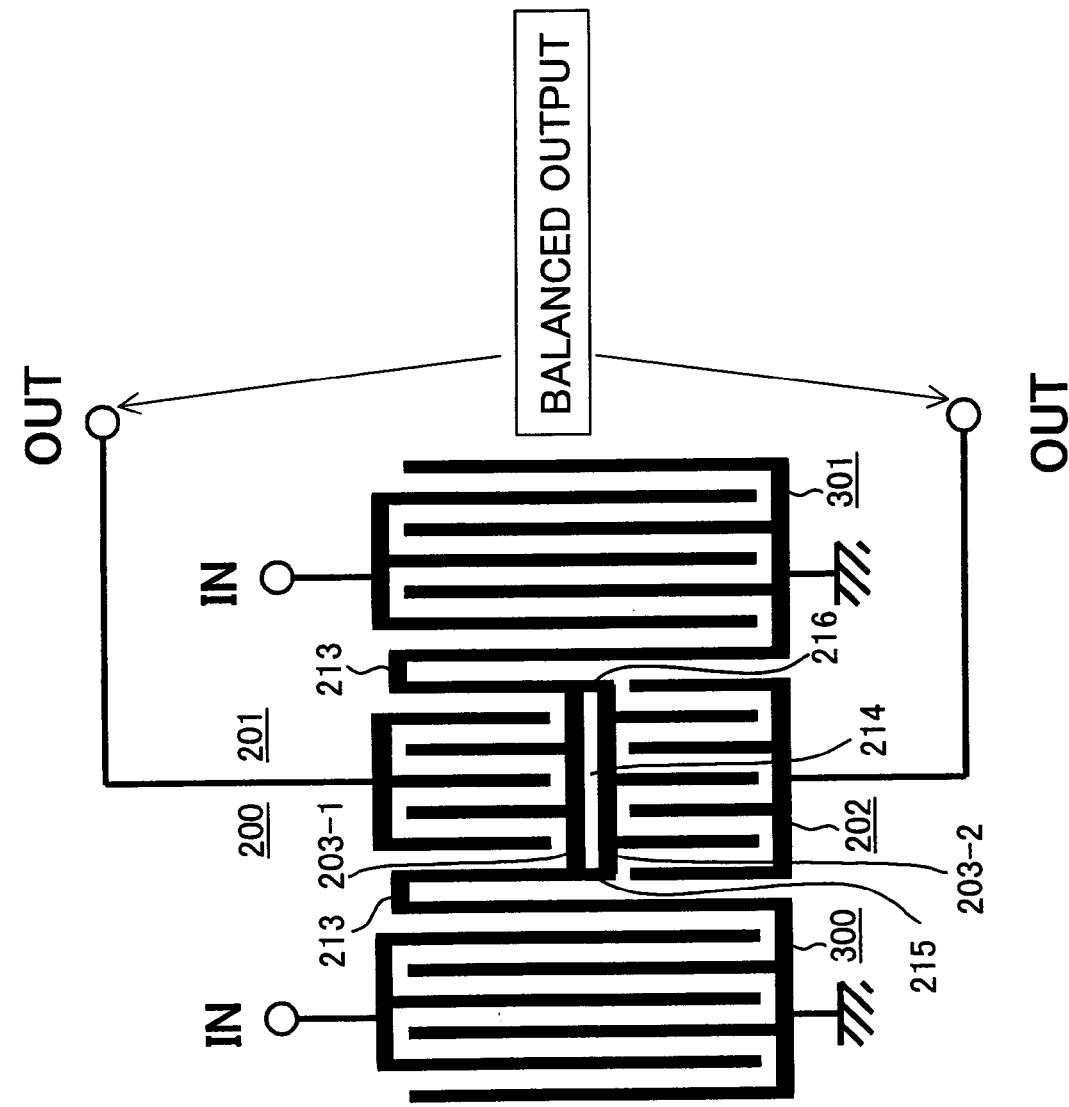
FIG. 9 shows a second embodiment according to the present invention, which improves on a dip.

FIG. 9 shows another embodiment according to the present invention including the second feature improving on the above-mentioned dip. Similar to the embodiment shown in FIG. 4, this embodiment includes input electrodes 300, 301, and balanced output electrode terminals 200 configured of a series connection of the first split IDT 201 and the second split IDT 202.

Moreover, as a feature, electrode 203 connecting the first split IDT 201 and the second split IDT 202 in series is no more the electrode of solid shape. Instead, electrode 203 is so structured as to have a gap 214.

Namely, electrode 203 is separated into a common electrode 203-1 of the comb electrode of the first split IDT 201 and a common electrode 203-2 of the comb electrode of the second split IDT 202, and gap 214 is provided between electrodes 203-1 and 203-2. Further, the common electrodes 203-1, 203-2 are connected by electrodes 216, 217 provided on the respective ends of gap 214.

Electrodes 216, 217 on the both ends of gap 214 are connected to the ground potential through electrodes 213 respectively connecting the comb electrodes of the neighboring input electrodes 300, 301.

In such a way, with electrode 203 connecting the first split IDT 201 and the second split IDT 202 in series, structured not of solid shape but in such a way as having gap 214, it becomes possible to eliminate the dip produced in the pass band.

In the characteristic chart related to the insertion loss shown in FIG. 8, the dip shown in graph I disappears in the graph II which illustrates the characteristic according to the embodiment shown in FIG. 9. It may be understood that the insertion loss is decreased by the second feature of the present invention.

Figure 10:
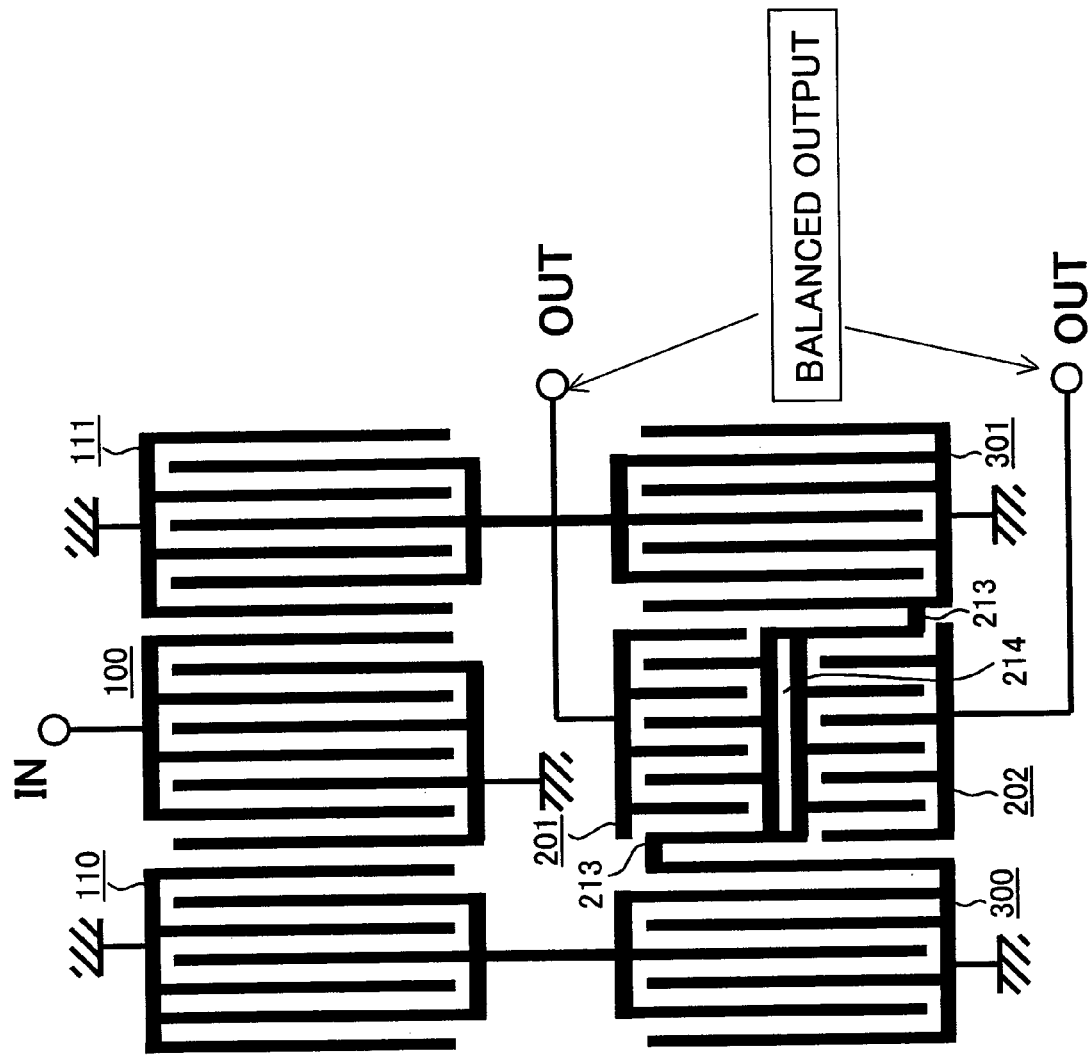
FIG. 10 shows an application example in which the structure of the second feature of the present invention is applied to the embodiment having the first feature shown in FIG. 5.

Similarly to the embodiment shown in FIG. 9, FIG. 10 shows an application example in which the structure of providing gap 214 in electrode 203, connecting the first split IDT 201 and the second split IDT 202 in series, according to the second feature of the present invention is applied to the embodiment having the first feature shown in FIG. 5.

In this embodiment also, the first and second features of the present invention may be included.

Here, as the second feature of the present invention, it is also possible to have other structures, without limited to the aspect of gap 214 shown in FIGS. 9, 10.

Figure 11:
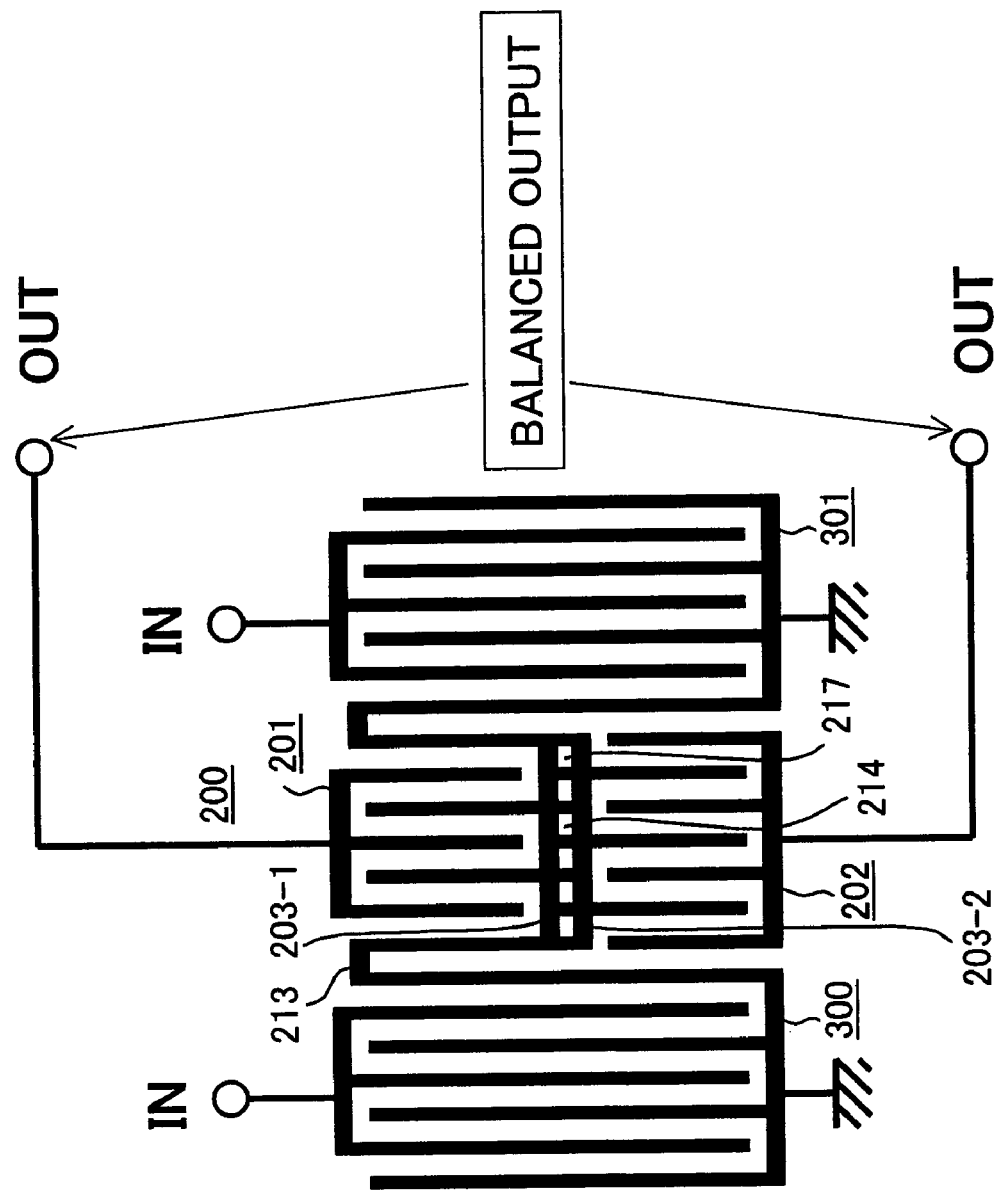
FIG. 11 shows another embodiment achieving the second feature of the present invention.

FIG. 11 shows another embodiment achieving the second feature of the present invention. As compared with the embodiment shown in FIG. 9, gap 214 located between the common electrode 203-1 of the first split IDT 201 and the common electrode 203-2 of the second split IDT 202 is connected with a plurality of electrodes 217.

Figure 12:
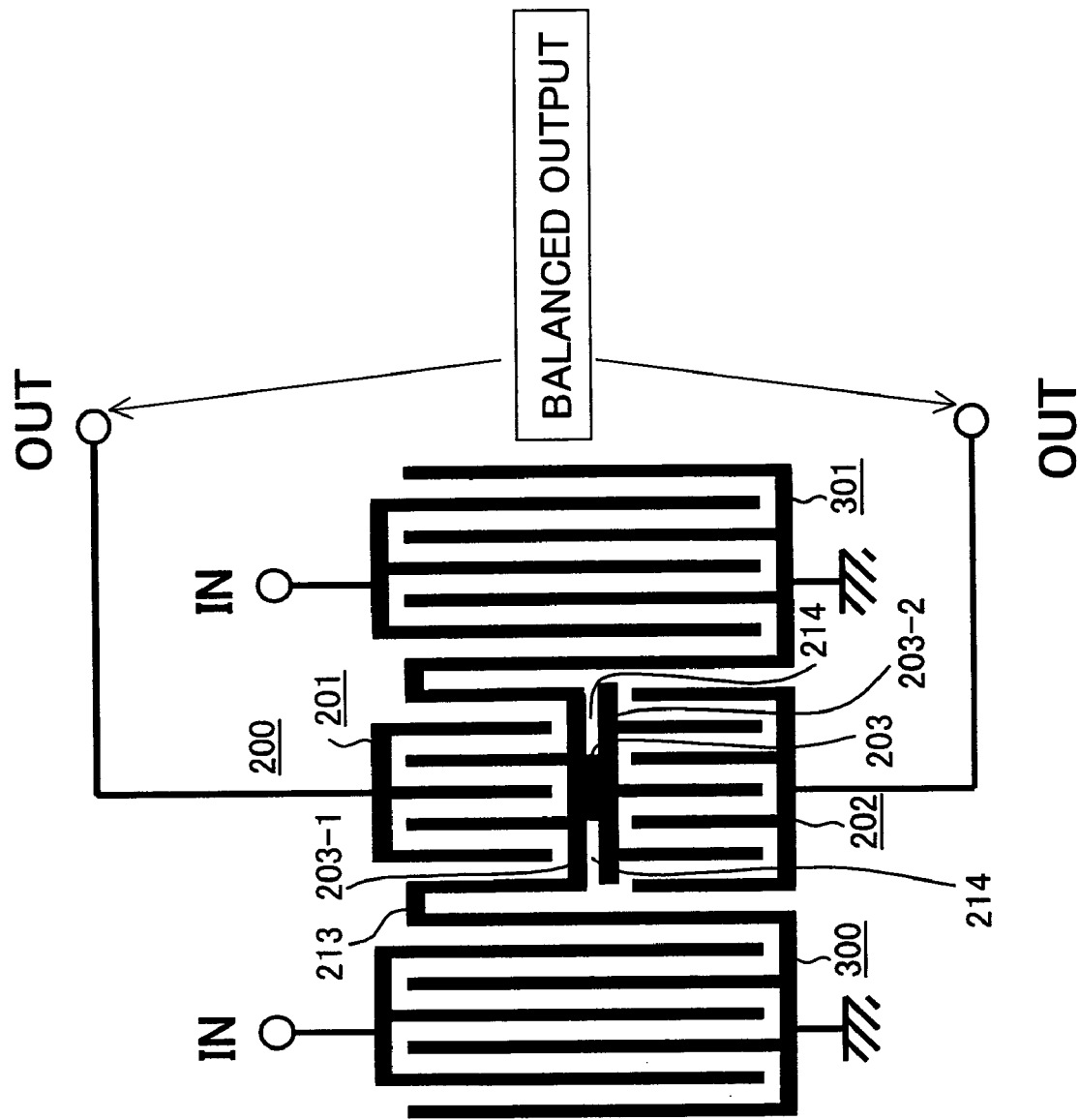
FIG. 12 shows still another embodiment achieving the second feature of the present invention.

FIG. 12 shows still another embodiment achieving the second feature of the present invention. In the embodiment shown in FIG. 12, as compared with the embodiment shown in FIG. 4, gap 214 is provided on both ends of electrode 203 by forming electrode 203, connecting in series the common electrode 203-1 of the first split IDT 201 and the common electrode 203-2 of the second split IDT 202, to have a shortened length. With such a structure, it is also possible to achieve the first and second features of the present invention.

INDUSTRIAL APPLICABILITY

The embodiments having been described according to the drawings, it becomes possible to achieve improvement on an insertion loss, as well as phase balance, in surface acoustic wave device having an unbalanced-to-balanced conversion function.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. Surface acoustic wave device comprising:
   a piezoelectric substrate; and
   an interdigital transducer for input and an interdigital transducer for output, which are respectively disposed on a propagation path of a surface acoustic wave on the piezoelectric substrate, and constituted of at least one interdigital transducer or more,
   wherein, when an aperture length of the electrode fingers of the interdigital transducer for input or the interdigital transducer for output is defined as X, the interdigital transducer for input or the interdigital transducer for output comprises two split interdigital transducers respectively including electrode fingers having an aperture length of approximately X/2, and
   electrodes of respective electrode fingers in the first and second split interdigital transducers are extracted from the two split interdigital transducers, and disposed in such a way as signals in the two outputs or inputs connected to a balanced terminal pair have a phase difference of 180, and
   the two split interdigital transducers are connected in series by a common electrode of solid shape, of which electrode width is greater than twice the pitch of the electrode fingers in the two split interdigital transducers, and further
   the common electrode is connected to the ground potential.

2. The surface acoustic wave device according to claim 1, further comprising:
   an interdigital transducer neighboring the two split interdigital transducers,
   wherein the common electrode is connected to the ground potential through the electrode finger of the neighboring interdigital transducer.

3. The surface acoustic wave device according to claim 1, further comprising:
   interdigital transducers for transmission and reception,
   wherein the interdigital transducer for input and the interdigital transducer for output are connected in two stages by the interdigital transducers for transmission and reception.

4. A surface acoustic wave device comprising:
   a piezoelectric substrate; and
   an interdigital transducer for input and an interdigital transducer for output, which are respectively disposed on a propagation path of a surface acoustic wave on the piezoelectric substrate, and constituted of at least one interdigital transducer or more,
   wherein, when an aperture length of the electrode fingers of the interdigital transducer for input or the interdigital transducer for output is defined as X, the interdigital transducer for input or the interdigital transducer for output comprises a first and second split interdigital transducers respectively including electrode fingers having an aperture length of approximately X/2, and
   electrodes of respective electrode fingers in the first and second split interdigital transducers are extracted from the two split interdigital transducers, and disposed in such a way as signals in the two outputs or inputs connected to a balanced terminal pair have a phase difference of 180°, and
   a gap is provided between a first common electrode commonly connecting the electrode fingers of the first split interdigital transducer and a second common electrode commonly connecting the electrode fingers of the second split interdigital transducer, and further
   the first and second common electrodes are connected to the ground potential,
   wherein the gap provided between the first common electrode and the second common electrode is connected by only an electrode on each end of the gap.

5. A surface acoustic wave device comprising:
   a piezoelectric substrate; and
   an interdigital transducer for input and an interdigital transducer for output, which are respectively disposed on a propagation path of a surface acoustic wave on the piezoelectric substrate, and constituted of at least one interdigital transducer or more,
   wherein, when an aperture length of the electrode fingers of the interdigital transducer for input or the interdigital transducer for output is defined as X, the interdigital transducer for input or the interdigital transducer for output comprises a first and second split interdigital transducers respectively including electrode fingers having an aperture length of approximately X/2, and
   electrodes of respective electrode fingers in the first and second split interdigital transducers are extracted from the two split interdigital transducers, and disposed in such a way as signals in the two outputs or inputs connected to a balanced terminal pair have a phase difference of 180°, and
   a gap is provided between a first common electrode commonly connecting the electrode fingers of the first split interdigital transducer and a second common electrode commonly connecting the electrode fingers of the second split interdigital transducer, and further
   the first and second common electrodes are connected to the ground potential,
   wherein the gap between the first common electrode and the second common electrode is connected by only one electrode, the length of which is smaller than the lengths of the first and second common electrodes.

* * * * *